United States Patent
Weatherley (12)

(10) Patent No.: US 6,333,472 B1
(45) Date of Patent: Dec. 25, 2001

(54) REDUCTION OF CROSSTALK IN DATA TRANSMISSION SYSTEM

(76) Inventor: Richard Weatherley, 43-45 Salthouse Road, Cornwell Business Park, Brackmills, Northampton NN4 7EX (GB)

( * ) Notice: Subject to any disclaimer, the term of this patent is extended or adjusted under 35 U.S.C. 154(b) by 0 days.

(21) Appl. No.: 09/673,108

(22) PCT Filed: Apr. 8, 1999

(86) PCT No.: PCT/GB99/01071

§ 371 Date: Dec. 4, 2000

§ 102(e) Date: Dec. 4, 2000

(87) PCT Pub. No.: WO99/53573

PCT Pub. Date: Oct. 21, 1999

(30) Foreign Application Priority Data

Apr. 8, 1998 (GB) .................................................. 9807616

(51) Int. Cl.[7] .............................. H01R 12/04; H05K 1/11
(52) U.S. Cl. ........................... 174/262; 361/767; 361/777; 361/792
(58) Field of Search ...................... 361/792, 793, 361/794, 795, 767, 768, 771, 777, 779, 783; 174/262, 260, 261

(56) References Cited

U.S. PATENT DOCUMENTS

| | | | |
|---|---|---|---|
| 4,544,801 | * | 10/1985 | Rudik et al. .......................... 174/68.5 |
| 4,551,789 | * | 11/1985 | Schletter et al. ...................... 361/406 |
| 5,039,824 | * | 8/1991 | Yakashima et al. .................... 174/33 |
| 5,682,298 | * | 10/1997 | Raynham .............................. 361/794 |
| 5,717,556 | * | 2/1998 | Yanagida .............................. 361/803 |

* cited by examiner

*Primary Examiner*—Jeffrey Gaffin
*Assistant Examiner*—José H Alcala
(74) *Attorney, Agent, or Firm*—Dykema Gossett PLLC

(57) ABSTRACT

A circuit board (1) for use in a connector between cables of a data transmission system has at least one array of input terminals (T1–T8) for incoming signals, at least one array of output terminals (t1–t8) for outgoing signals, and a respective conductive track (5) connecting each input terminal to a respective output terminal. Closed loops (6, 7, 8) of conductive material are connected to at least some of the terminals or conductive tracks, the loops being positioned on the circuit board to reduce crosstalk from the levels which would exist within the connector in the absence of such closed loops. The loops associated with one terminal will be positioned on the board opposite loops associated with another terminal or terminals to produce coupling therebetween. The invention is particularly applicable to RJ45 plug and jack systems.

10 Claims, 3 Drawing Sheets

REDUCTION OF CROSSTALK IN DATA TRANSMISSION SYSTEM

This invention relations to the reduction of crosstalk in data transmission systems, and more particularly to the reduction of crosstalk associated with connectors in data communication systems.

It is well recognised that when a signal is applied to a pair of unshielded conductors a signal will be induced in adjacent conductors. This phenomenon is known as "crosstalk" and the induced signal is, so far as the conductor in which it is induced is concerned, a noise signal which reduces the signal-to-noise ratio of the conductor.

Data communication systems frequently use cables consisting of four pairs of conductors. Each pair of conductors is twisted together and such cables are generally known as "UTP" (standing for "Unshielded Twisted Pair") cables. The problem of crosstalk within such cables is adequately addressed by varying the twist rate of the individual pairs and by other expedients known to those skilled in the art. A problem arises, however, at points within a system where connections must be made between the UTP cable and another cable or fixed installation. Within the zone of such connections the pairs must be separated from each other, and, at least to some extent, each pair must be untwisted in order to form a connection. This disruption of the standard pattern of the UTP cable produces crosstalk in the zone of the connection.

The problem is particularly acute, but is not limited to, connectors which comprise a plug and jack socket for forming a releasable connection. In the most commonly used wiring convention (known as RJ45) the conductors of a four pair UTP cable are separated and are connected to eight parallel contacts of a plug. A socket of the jack, into which the plug is in use, inserted, has eight parallel contacts for mating with the eight contacts of the plug. This arrangement of parallel contacts on the plug and parallel contacts on the jack gives rise to significant crosstalk. Further, in many installations it is impractical to connect a cable direct to the jack and accordingly the jack socket is mounted on a circuit board on which is also mounted one or more connectors for receiving conductors to be connected to the jack. Tracks on the circuit board connect the connectors to the contacts of the socket. These tracks may also give rise to crosstalk.

The problem is particularly acute in the case of the RJ45 wiring convention since in this case the conductors of one twisted pair are connected to the center two contacts of the jack (by convention pins 4 and 5) whilst the conductors of another twisted pair are connected to the contacts which are located immediately outwardly of pins 4 and 5 (i.e. Pins 3 and 6). This arrangement whereby the contacts of the jack associated with one twisted pair are located between the contacts associated with another twisted pair gives rise to particularly high levels of crosstalk between the respective twisted pairs.

A number of solutions to the above problems have been proposed. Notably, United Kingdom patent publication GB-A-2269941 proposes a number of connection arrangements in which the tracks on a circuit board are specially routed with a view to reducing crosstalk. Two distinct arrangements are described within the patent publication. According to one arrangement, if conductors are presented to the circuit board in the order ABCD the tracks are routed on the circuit board so that the tracks associated with conductors A and C are close to each other, but are spaced from the tracks associated with conductors B and D, which are also close to each other. In the second arrangement proposed in GB-A-2269941 the tracks on the board associated with conductors A and C crises-cross each other so as to simulate a twisted effect. Likewise, tracks associated with conductors B and D crises-cross each other to simulate a twisted effect.

In an alternative solution which has been used successfully for a number of years by R.W. Data Limited of 43–45 Salt house Road, Cornwell Business Park, Brackmills, Northampton, NN4 7EX, the circuit board is provided with relatively large areas of copper sheet connected to the respective tracks so that areas of copper sheet on one side of the board associate with areas of copper sheet on the opposite side of the board to form parallel plate capacitors. By appropriately selecting the areas and the tracks to which they are connected a substantial reduction in crosstalk can be obtained.

We have now discovered a further method of reducing crosstalk in such circumstances. The new method offers the advantage that relatively short and direct conductive tracks may be used for connecting the pins of the jack to the pins of the connectors on the circuit boards, but at the same time crosstalk can be reduced to an acceptable level. Further, the new arrangement provides a significant increase in flexibility in circuit board design as compared with either the techniques of GB-A-2269941 or the previous technique of R.W. Data referred to above. It is accordingly believed that the new method can lead to a better overall reduction in crosstalk, eliminating or substantially reducing not only crosstalk associated with the jack itself but also crosstalk induced by the disruption to the normal twisted pair arrangement of conductors which occurs in the immediate vicinity of the Jack and the immediate vicinity of the connections on the circuit board to the cable.

Accordingly, one aspect of the present invention provides a circuit board for use in a connector between cables of a data transmission system, the circuit board comprising at least one array of input terminals for incoming signals, at least one array of output terminals for outgoing signals; a respective conductive track connecting each input terminal to a respective output terminal; and closed loops of conductive material connected to at least some of the terminals or conductive tracks, the loops being positioned on the circuit board to reduce crosstalk from the levels which would exist within the connector in the absence of such closed loops.

The exact size, shape and position of the closed loops will be determined by the crosstalk to be reduced and may vary in light of the particular characteristics of the installation in which the circuit board is to be used. In a typical installation in which a plug and jack socket is used to provide a releasable connection between cables, the closed loops will be sized and positioned so as to eliminate so far as possible the overall crosstalk within the system induced by all conductor arrangements from the point where the conductors of the UTP cable are separated from their standard laid arrangement for connection to the plug to the point where the conductors of the UTP cable are separated from their usual laid arrangement for connection to the connectors provided on the circuit board. Since it is envisaged that the invention will be capable of eliminating or substantially reducing crosstalk of the overall connector it will be appreciated that the exact position and layout of the loops must to some extent be empirically derived once the particular arrangement of the incoming and outgoing cables has been settled. As a general guide, however, it is envisaged that a loop provided on one side of the circuit board and connected to the terminals associated with one conductor of one pair will be matched on the opposite side of the circuit board by a loop connected to the terminals associated with a conductor of another pair.

In some cases a single loop will be provided connected to the terminals associated with one conductor. In other cases, a plurality of loops will be provided. In the case where a plurality of loops are provided, the different loops associated with one pair of terminals may be located on the opposite side of the circuit board and overlying loops associated with a plurality of other terminals. For example, a total of three loops may be connected to the input terminal 1/output terminal 1 pair, and of these three loops one may be matched on the opposite side of the circuit board by a loop associated with input terminal 3/output terminal 3, another may be matched by a loop associated with input terminal 6/output terminal 6 and the third may be matched by a loop associated with input terminal 5/output terminal 5.

The loops associated with any given input terminal/output terminal pair may all be located on the same side of the circuit board, or may be in part located on one side of the circuit board and in part on the other side of the circuit board.

If particularly complex arrangements of loops are required, a multi-layered circuit board may be employed with some of the loops embedded within the thickness of the circuit board.

The loops may be formed by the conductive track which connects the input terminal to its associated output terminal. In effect, the track may separate into two tracks and subsequently converge into a single track to form the required loop. Alternatively, the loops may be separate from the conductive track connecting the input terminal to the output terminal and be located as "cul-de-sac" connections leading from either the input terminal or output terminal, or from the conductive track connecting the input terminal to the output terminal. A combination of loops formed by the conductive track and cul-de-sac loops may be used associated with any particular input/output terminal pair.

The invention will be better understood from the following description of a preferred embodiment thereof, given by way of example only, reference being had to the accompanying drawings wherein:

FIGS. 3-1 to 3-8 illustrate the tracks associated respectively with input/output terminals 1 to 8.

Figure 1:
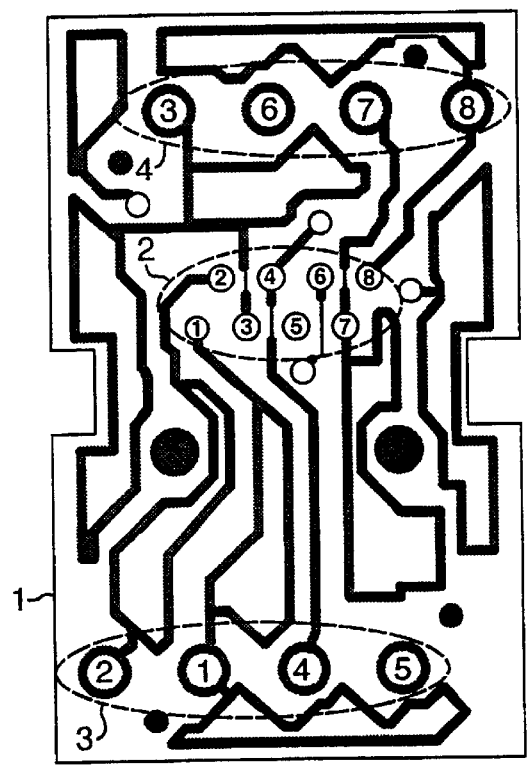
FIG. 1 illustrates, from one side, a circuit board adapted to receive a jack socket and two terminal blocks, the conductive tracks on the surface of the board visible in the drawings being shown in black.
Figure 2:
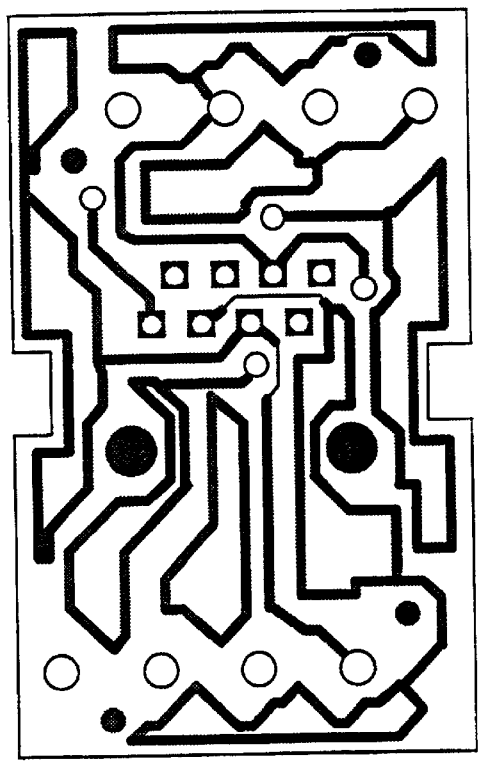
FIG. 2 is a view of the track layout on the opposite face of the board from that visible in FIG. 1, the track layout being viewed through the board.

Referring firstly to FIGS. 1 and 2, there is illustrated a circuit board 1 upon which, in use, is mounted a jack socket and two krone type connector blocks.

FIG. 1 illustrates the face of the board (hereinafter referred to as "the obverse face") upon which the jack socket is to be mounted. As will be appreciated by those skilled in the art an RJ45 jack socket has eight connecting pins extending from the rear face thereof, and eight holes for the receipt of such pins are provided in the zone 2 of the board. In use, krone type connectors are connected to the face of the board opposite from that visible in FIG. 1 (hereinafter "the reverse face") and for this purpose an array 3 of four mounting holes is provided on one end of the board and an array 4 of four mounting holes is provided on the other end of the board. Tracks, illustrated in black in FIG. 1, are provided on the obverse face of the board. Tracks are also provided on the reverse face of the board, and the arrangement of these tracks is illustrated in FIG. 2. It must be stressed that in FIG. 2 the tracks on the reverse face are viewed from the same side of the board as FIG. 1 and are thus as the tracks would appear if the board was transparent and there were no tracks on the obverse face of the board. In practice, when viewed from the reverse face the tracks would appear as a mirror-image of the track arrangement illustrated in FIG. 2. The tracks provided on the faces of the board between them provide conductive tracks connecting each terminal associated with a jack socket pin to a corresponding terminal associated with a krone block pin and also provide a multiplicity of closed loops which are either connected to the conductive tracks or are connected directly to one or both of the terminals of each terminal pair.

Figures 1, 3:
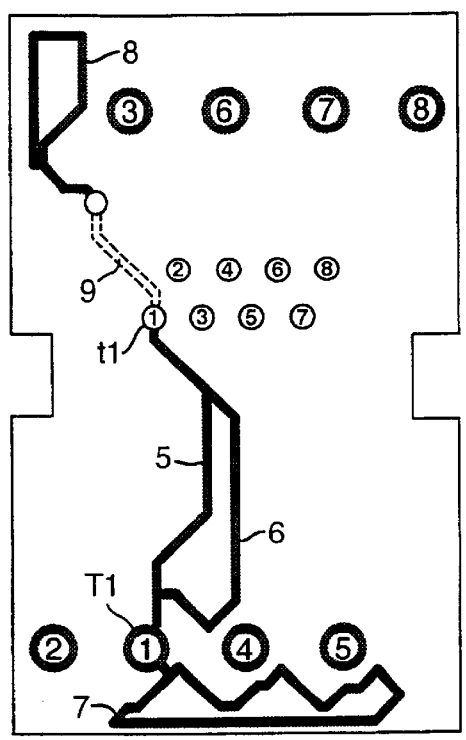
Figures 2, 3:
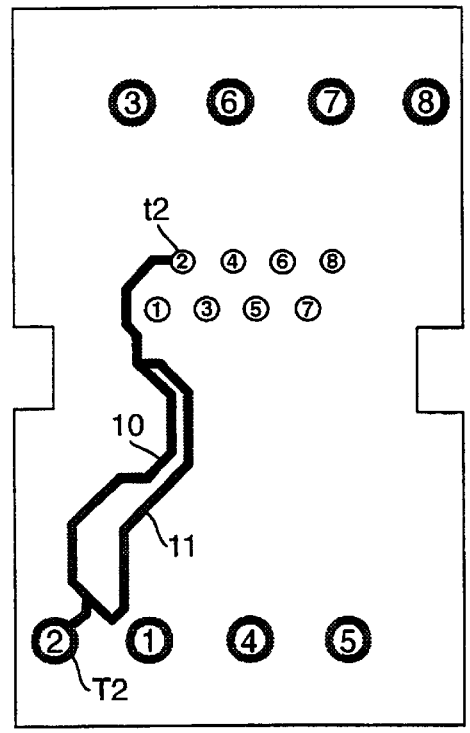
Figure 3:
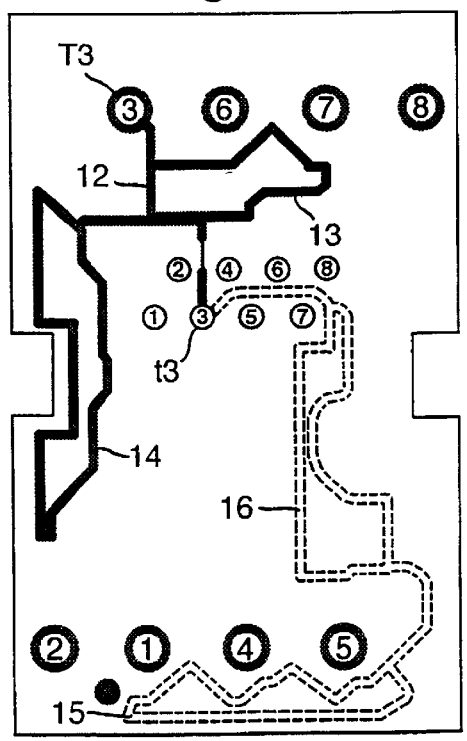

The track arrangements are shown in greater detail in FIGS. 3-1 to 3-8. FIG. 3-1 illustrates the conductive track and closed loops associated with one pair of input and output terminals, FIG. 3-2 illustrates the conductive track and closed loop associated with another pair of input and output terminals, etc. For the purposes of FIGS. 3-1 to 3-8 the terminals for receipt of the jack socket have been provided with their conventional RJ45 numbering-i.e. FIG. 3-1 illustrates the tracks and loops associated with RJ45 terminal 1; FIG. 3-2 illustrates the conductive track and loop associated with RJ45 terminal 2, etc. In FIGS. 3-1 to 3-8 the tracks located on the side of the board on which the jack socket is mounted (the obverse face) are shown in solid lines, and the tracks located on the other side of the board (the reverse face) are shown in broken lines.

Referring firstly to FIG. 3-1, the tracks associated with RJ45 terminal 1 and its associated crone block terminal 1 are shown. These tracks consist of a conductive track 5 which provides a direct connection between the jack socket terminal 1 (marked t1) and the Krone block terminal 1 (marked T1). The conductive track 5 is, in its central region, divided to form a closed loop 6. A further closed loop 7 is formed adjacent terminal T1 and is connected directly thereto. A third closed loop 8 is formed in the top left-hand corner of the board (as illustrated in FIG. 3-1) and is connected to terminal t1 by a track 9 located on the reverse face of the board.

Moving on to FIG. 3-2, a conductive track 10 connects terminal t2 associated with the jack socket to terminal T2 of a krone block. The track divides between the ends thereof to provide a closed loop 11.

FIG. 3-3 illustrates the conductive track and loops associated with terminals t3/T3. It will be seen that a conductive track 12 directly connects terminal t3 to terminal T3. A closed loop 13 is in part bounded by the conductive track 12 and a second closed loop 14 is provided on the obverse face of the board. Two interconnected closed loops 15,16 are provided on the reverse face of the board.

Figures 3, 4:
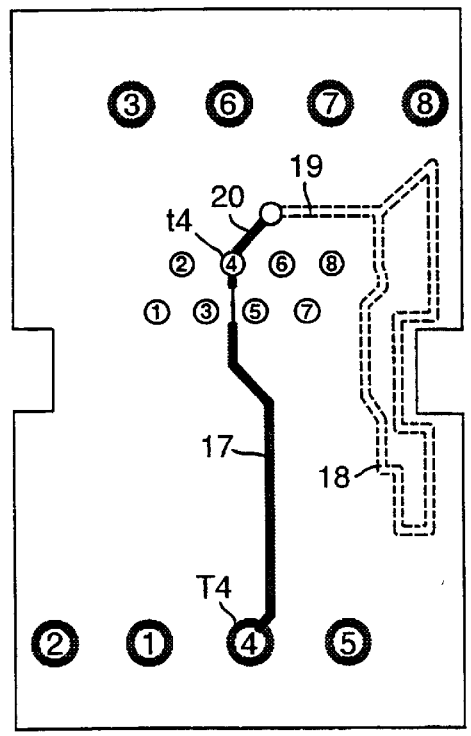

In FIG. 3-4 it will be seen that a conductive track 17 connects terminal t4 directly to terminal T4 and a closed loop 18 is provided on the reverse face of the board connected to the terminal t4 by a track 19 located on the reverse face of the board and a track 20 located on the obverse face of the board.

Figures 3, 4, 5:
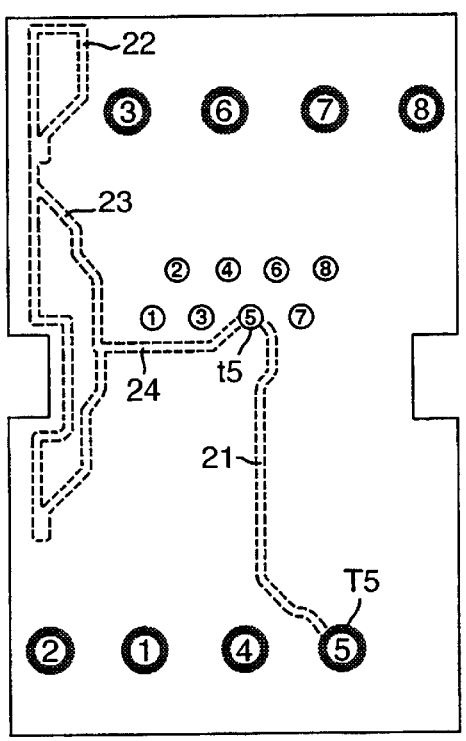
Figures 3, 4, 5, 6:
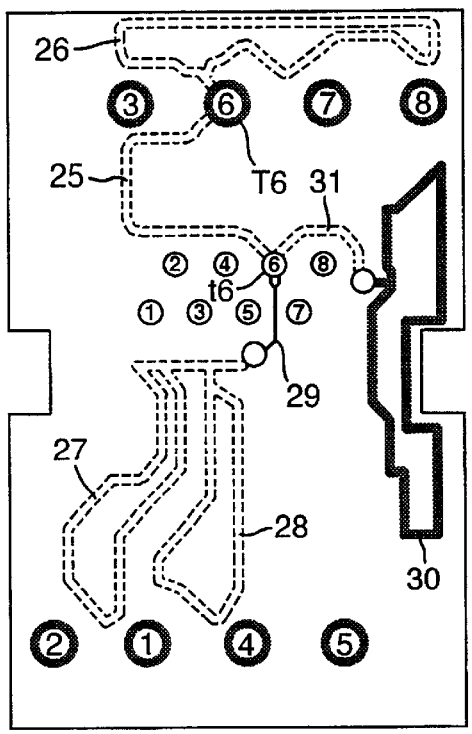
Figures 3, 4, 5, 6, 7:
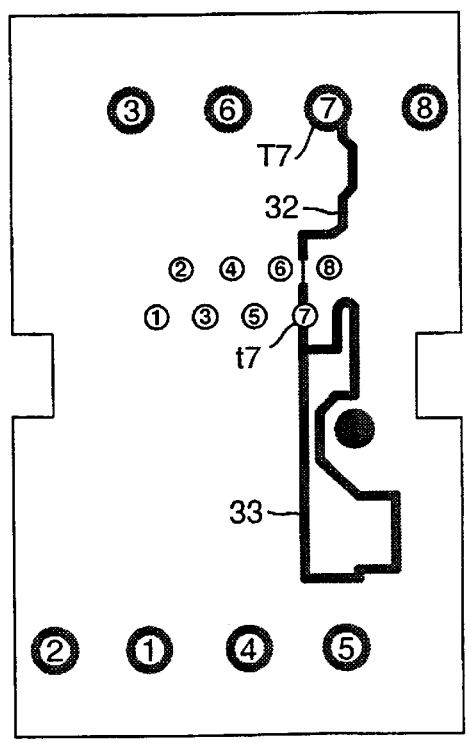
Figures 3, 4, 5, 6, 7, 8:
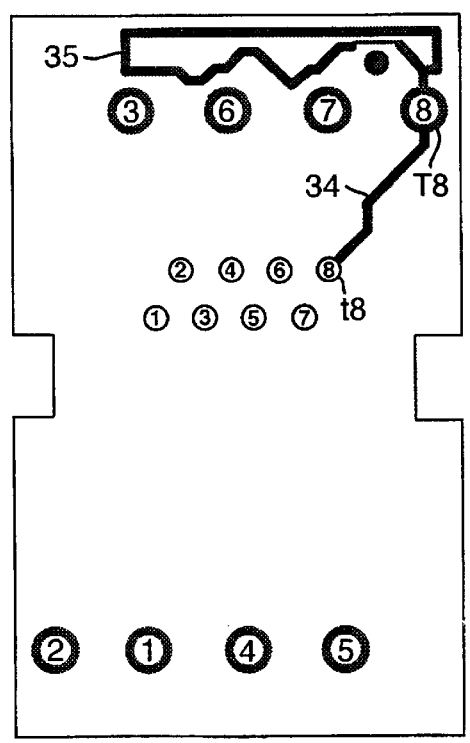

In FIG. 3-5 the conductive track and loop associated with terminals t5 and T5 are shown. These consist of a conductive track 21 which connects terminal t5 directly to terminal T5 on the reverse face of the board and two interconnected closed loops 22,23 located on the reverse face of the board and connected directly to the terminal t5 by a track 24.

In FIG. 3-6, the tracks associated with terminals t6 and T6 are shown. These consist of a conductive track 25 located on the reverse face of the board, a closed loop 26 located on the reverse face of the board and connected directly to the terminal T6, a pair of closed loops 27,28 located on the reverse face of the board and connected to the terminal t6 by the track 29 located on the obverse face of the board, and a closed loop 30 located on the obverse face of the board and connected to the terminal t6 by a track 31 located on the reverse face of the board.

FIGS. 3-7 and 3-8 illustrate the conductive tracks and loops respectively with the terminals t7/T7 and t8/T8. A conductive track 32 connects terminal t7 to terminal T7 on the obverse face of the board and a closed loop 33 on the obverse face of the board is connected directly to terminal t7. A conductive track 34 located on the obverse face of the track directly connects terminal t8 to terminal T8 and a closed loop 35 located on the obverse face of the board is connected directly to the terminal t8.

By comparing the various parts of FIG. 3 it will be noted that each loop on one side of the board generally corresponds to and overlies a loop located on the opposite side of the board. For example, the loop 8 of FIG. 3-1 overlies the loop 22 of FIG. 3-5; the loop 6 of FIG. 3-1 overlies the loop 28 of FIG. 3-6; and the loop 7 of FIG. 3-1 overlies the loop 15 of FIG. 3-3. Thus, the loops 6,7,8 associated with the terminal pair t1/T1 overlie respectively loops associated with terminals t6/T6, t3/T3 and t5/T5. In the case of a terminal pair where only a single loop is provided, for example the single loop 11 associated with terminals t2/T2, this overlies only one loop (in this case loop 27 associated with terminals t6/T6).

The exact arrangement of conductive tracks and loops will be determined empirically in light of the particular crosstalk problems associated with a particular connector arrangement. Typically, these crosstalk problems will in part be induced by the jack socket, will in part be induced by the plug which mates with the jack, and will in part be induced by the disruption to the normal laid pattern of the UTP cables which are connected to the jack and to the krone blocks. Once these parameters have been determined for a particular installation (in other words once the particular design of RJ45 plug and jack socket have been determined and the types of connection to them have been established) the tracks will be selected to minimise crosstalk.

Whilst, in many applications, the invention will significantly reduce or substantially eliminate the crosstalk produced by the complete plug and jack installation, it should be appreciated that if the plug itself is designed to produce little or no crosstalk the techniques of the present invention may be utilised to eliminate only the crosstalk produced by the jack, its associated circuit board, and the disruption of the UTP cable necessary for connection to the circuit board.

The conductive tracks interconnecting the terminals, and the tracks forming the loops can be laid down by conventional techniques used for forming printed circuit boards. The width and the thickness of the tracks can be selected to provide the required conductivity and crosstalk reduction.

What is claimed is:

1. A circuit board for use in a connector between cables of a data transmission system, the circuit board comprising at least one array of input terminals for incoming signals, at least one array of output terminals for outgoing signals; a respective conductive track connecting each input terminal to a respective output terminal; and closed loops of conductive material connected to at least some of the terminals or conductive tracks, the loops being positioned on the circuit board to reduce crosstalk from the levels which would exist within the connector in the absence of such closed loops.

2. A circuit board according to claim 1 wherein loops are provided on both sides of the circuit board.

3. A circuit board according to claim 1 wherein the circuit board is multi-layered and loops are embedded within the thickness of the circuit board.

4. A circuit board according to claim 1 wherein a plurality of loops are connected to one of the terminals or conductive tracks.

5. A circuit board according to claim 4 wherein one of said plurality of loops is located on one side of the circuit board and another of said loops is located embedded within or is on the opposite side of the circuit board.

6. A circuit board according to claim 1 wherein the loops are formed by the conductive track which connects an input terminal to its associated output terminal.

7. A circuit board according to claim 1 wherein a loop is formed separately from the conductive track connecting an input terminal to its associated output terminal and is connected to the input terminal, or the conductive track connecting the input terminal to the output terminal.

8. A circuit board according to claim 1 wherein a loop which is connected to one pair of terminals is superimposed on a loop which is connected to a different pair of terminals.

9. A circuit board according to claim 1 wherein a loop or loops connected to one pair of terminals is superimposed on respective loops connected to respective different pairs of terminals.

10. A circuit board according to claim 1 wherein the or each loop is formed as a printed circuit track.

* * * * *